(12) United States Patent
Singh et al.

(10) Patent No.: US 9,666,717 B2
(45) Date of Patent: May 30, 2017

(54) SPLIT WELL ZERO THRESHOLD VOLTAGE FIELD EFFECT TRANSISTOR FOR INTEGRATED CIRCUITS

(71) Applicant: GLOBALFOUNDRIES Inc., Grand Cayman (KY)

(72) Inventors: Jagar Singh, Malta, NY (US); Konstantin G. Korablev, Saratoga Springs, NY (US); Andy Chih-Hung Wei, Queensbury, NY (US)

(73) Assignee: GLOBAL FOUNDRIES, INC., Grand Cayman (KY)

(*) Notice: Subject to any disclaimer, the term of this patent is extended or adjusted under 35 U.S.C. 154(b) by 192 days.

(21) Appl. No.: 14/217,691

(22) Filed: Mar. 18, 2014

(65) Prior Publication Data
US 2015/0270400 A1   Sep. 24, 2015

(51) Int. Cl.
| | |
|---|---|
| H01L 29/40 | (2006.01) |
| H01L 29/78 | (2006.01) |
| H01L 29/417 | (2006.01) |
| H01L 29/66 | (2006.01) |
| H01L 29/36 | (2006.01) |
| H01L 21/265 | (2006.01) |

(52) U.S. Cl.
CPC .......... *H01L 29/7851* (2013.01); *H01L 29/36* (2013.01); *H01L 29/41783* (2013.01); *H01L 29/41791* (2013.01); *H01L 29/66795* (2013.01); *H01L 21/26586* (2013.01)

(58) Field of Classification Search
CPC . H01L 29/7851; H01L 27/0928; H01L 29/78; H01L 29/40; H01L 29/66; H01L 29/417; H01L 29/41783; H01L 29/66795; H01L 29/408; H01L 29/41791
USPC .......................................... 257/402; 438/157
See application file for complete search history.

(56) References Cited

U.S. PATENT DOCUMENTS

| | | | |
|---|---|---|---|
| 6,764,890 B1 | 7/2004 | Xu | |
| 8,772,149 B2* | 7/2014 | Cartier | H01L 29/66795 438/591 |
| 2012/0211841 A1* | 8/2012 | Kurjanowicz | G11C 17/16 257/369 |
| 2014/0029360 A1* | 1/2014 | Banna | H01L 27/105 365/189.011 |
| 2015/0357468 A1* | 12/2015 | Zhu | H01L 29/7851 257/192 |

* cited by examiner

*Primary Examiner* — Chuong A Luu
(74) *Attorney, Agent, or Firm* — Williams Morgan, P.C.

(57) ABSTRACT

Approaches for altering the threshold voltage (e.g., to zero threshold voltage) in a fin-type field effect transistor (FinFET) device are provided. In embodiments of the invention, a first N+ region and a second N+ region are formed on a finned substrate that has a p-well construction. A region of the finned substrate located between the first N+ region and the second N+ region is doped with a negative implant species to form an n-well. The size and/or composition of this n-well region can be adjusted in view of the existing p-well construction of the substrate device to change the threshold voltage of the FinFET device (e.g., to yield a zero threshold voltage FinFET device).

16 Claims, 11 Drawing Sheets

SPLIT WELL ZERO THRESHOLD VOLTAGE FIELD EFFECT TRANSISTOR FOR INTEGRATED CIRCUITS

BACKGROUND

Technical Field

This invention relates generally to the field of semiconductors, and more particularly, to forming a zero threshold voltage fin field effect transistor (FinFET) device.

Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well-known photolithographic masking, developing, and level definition (e.g., etching, implanting, deposition, etc.).

The FinFET is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

FET transistor devices, whether planar, fin, or otherwise, each have certain measurements that can be used to measure performance against other devices. One such measurement is that of threshold voltage ($V_t$). Threshold voltage can be defined as the value of the gate-source voltage when the conducting channel just begins to connect the source and drain contacts of the transistor, allowing significant current. In ICs, core MOSFET's having higher $V_t$ (0.3V range) in combination with the scaled drain voltage ($V_{dd}$) can create a limited dynamic range for analog input signals. With the technology node progression, the input signal range can get smaller, but the noise signal's magnitude usually remains the same. This can result in poor signal-to-noise ratio and smaller operational bandwidth.

In contrast, a zero $V_t$ ($ZV_t$) MOSFET (or natural transistor) generally turns on at or near gate voltage ($V_g$)=0V. These zero $V_t$ MOSFETs are commonly used in low voltage OP Amps, analog and/or digital and/or mixed signal circuitries, low power and/or interface circuit applications. An application of zero $V_t$ MOSFET in the circuits can significantly expand useful operating range of the signal, thus enabling rail-to-rail circuit operation of very low voltage analog circuits. $ZV_t$ MOSFETs are commonly used as pass gates, mainly due to the low gate MOS capacitance and higher $F_t$ (operating frequency) at near zero gate voltage ($V_g$).

While FinFET technology can provide superior levels of scalability, new challenges can arise in designing and/or fabricating these devices. For example, processes used to adjust $V_t$ during the fabrication process of a platform device may be unworkable or have unintended effects in the FinFET model.

SUMMARY

In general, approaches for altering the threshold voltage (e.g., to zero threshold voltage) in a fin-type field effect transistor (FinFET) device are provided. In embodiments of the invention, a first N+ region and a second N+ region are formed on a finned substrate that has a p-well construction. A region of the finned substrate located between the first N+ region and the second N+ region is doped with a negative implant species to form an n-well. The size and/or composition of this n-well region can be adjusted in view of the existing p-well construction of the substrate device to change the threshold voltage of the FinFET device (e.g., to yield a zero threshold voltage FinFET device).

One aspect of the present invention includes a method for forming a device, the method comprising: forming a first N+ region and a second N+ region on a finned substrate, the finned substrate having a p-well construction; and forming an n-well in a substance making up the finned substrate in a region of the finned substrate located between the first N+ region and the second N+ region.

Another aspect of the present invention includes a method for forming a zero threshold voltage ($ZV_t$) fin-shaped field effect transistor (FinFET) device, the method comprising: forming a first N+ region and a second N+ region on a finned substrate, the finned substrate having a p-well construction; and doping a region of the finned substrate located between the first N+ region and the second N+ region with a negative implant species forming a silicate over a subset of the RSD structures to form an n-well, wherein a constitution of the n-well within the p-well construction yields the $ZV_t$ FinFET device.

Yet another aspect of the present invention includes a fin-shaped field effect transistor (FinFET) device, formed via a process, comprising: a finned substrate having a p-well construction; a first N+ region and a second N+ region on the finned substrate; and a doped n-well of the finned substrate located between the first N+ region and the second region; wherein a constitution of the n-well within the p-well construction makes the FinFET device a zero threshold voltage ($ZV_t$) FinFET device.

BRIEF DESCRIPTION OF THE DRAWINGS

These and other features of this invention will be more readily understood from the following detailed description of the various aspects of the invention taken in conjunction with the accompanying drawings in which.

Figure 1:
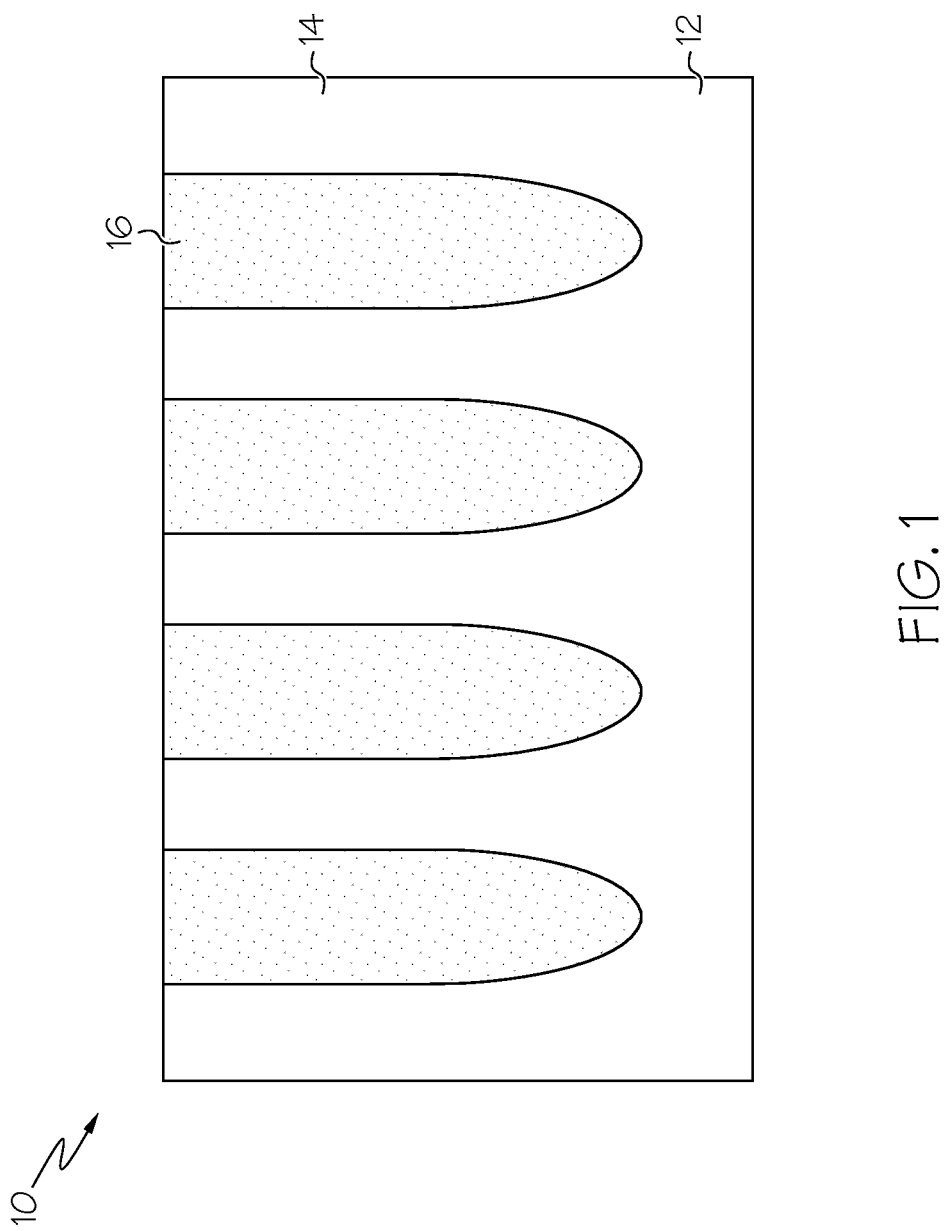
FIG. 1 shows a FinFET semiconductor device according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

As mentioned above, approaches for altering the threshold voltage (e.g., to zero threshold voltage) in a fin-type field effect transistor (FinFET) device are provided. In embodiments of the invention, a first N+ region and a second N+ region are formed on a finned substrate that has a p-well construction. A region of the finned substrate located between the first N+ region and the second N+ region is doped with a negative implant species to form an n-well. The size and/or composition of this n-well region can be adjusted in view of the existing p-well construction of the substrate device to change the threshold voltage of the FinFET device (e.g., to yield a zero threshold voltage FinFET device).

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
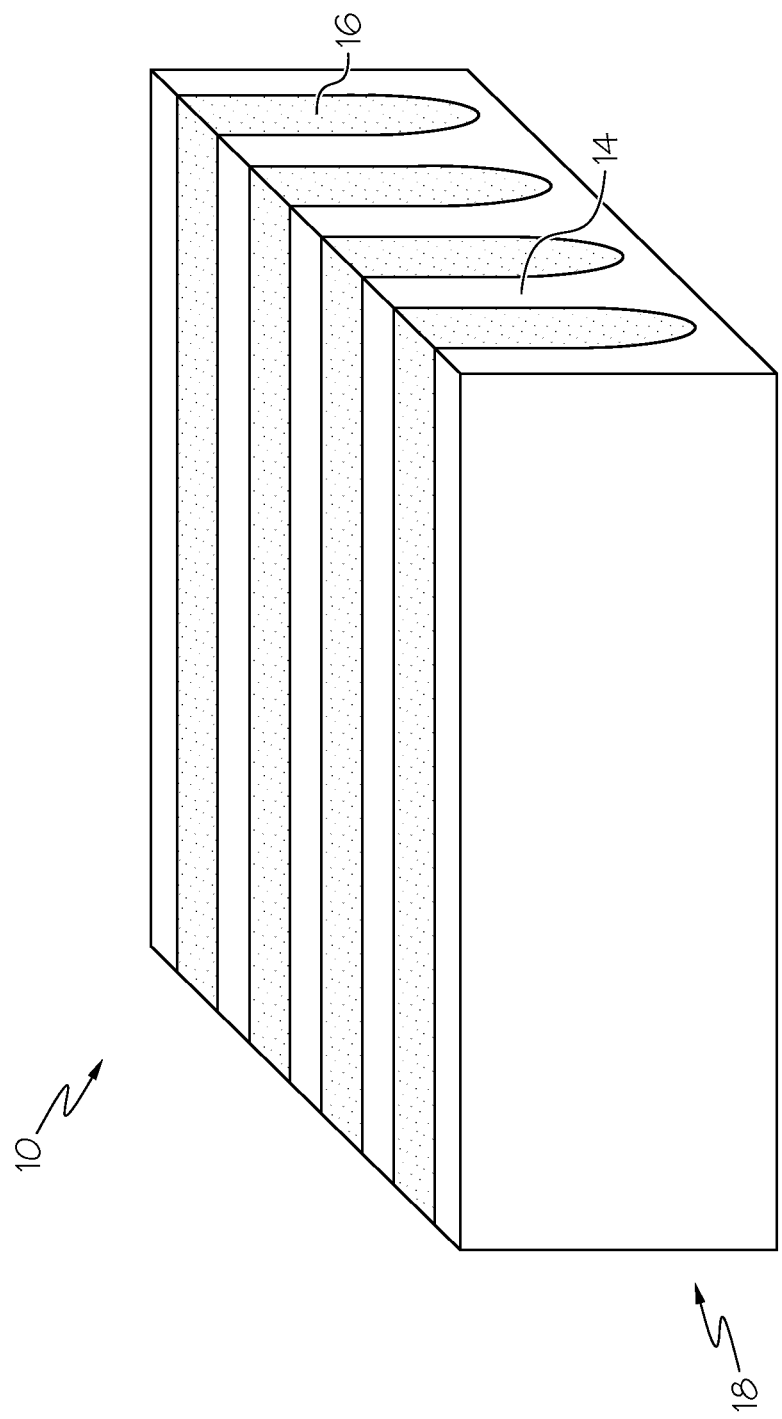
FIG. 2 shows a perspective view of the FinFET semiconductor device of FIG. 1 according to an embodiment of the present invention.

Referring now to FIG. 1, an initial formation stage of a semiconductor device 10 is shown. As depicted, the device 10 can be formed on a substrate 12 by forming a set of fins 14 from the substrate. To this extent, device 10 generally comprises a uniform, oxide-fin surface having a fin region 14 and an oxide fill 16. In general, the oxide-fin surface is formed by polishing (e.g., via CMP) oxide fill 16 to a top surface of fin region 14. This results in a substantially "planar" or "uniform" surface. FIG. 2 shows a perspective view of device 10 of FIG. 1 according to an embodiment of the present invention.

The term "substrate" 12 as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate 12 may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate 12 may be amorphous, polycrystalline, or single-crystalline. In addition to the aforementioned types of semiconductor substrates, the semiconductor substrate 12 employed in the present invention may also comprise a hybrid oriented (HOT) semiconductor substrate in which the HOT substrate has surface regions of different crystallographic orientation. The semiconductor substrate 12 may be doped, undoped, or contain doped regions and undoped regions therein. The semiconductor substrate 12 may contain regions with strain and regions without strain therein, or contain regions of tensile strain and compressive strain.

In many cases, the doping used in the formation of semiconductor substrate 12 is performed in such a manner that the semiconductor substrate 12 forms a p-well 18. The presence of p-well 18 reflects an overall positive orientation of semiconductor substrate 18. In a planar device, the semiconductor device can be easily adjusted to take into account conditions similar to p-well 18 and form a zero threshold voltage ($ZV_t$) device.

The inventors of this invention have discovered that the characteristics of FinFET-type devices 10 make this adjustment more difficult. For example, unlike planar devices, FinFET devices 10 are usually fully depleted devices. The width of the depletion regions of these devices 10 is limited by the width of each fin 16 (Dfin), particularly at very low channel (substrate) doping. Because of this depletion, a larger gate start voltage $V_{gs}$ is usually required for fins 16 to move from the depletion region, compared to a planar CMOS device. For example, an additional voltage $V_{inv}$ may be needed to bring enough inversion charge into channel 14 for device 10 to reach threshold voltage. This requirement of increased $V_{gs}$ can delay the formation of inversion regions in channel 14, which are necessary for the device 10 to perform its functions, for a given work function material. This can lead to a higher $V_t$ for a zero $V_t$ device 10. To date there has been no viable option for producing a $ZV_t$ FinFET device. Particularly, no solution for producing such a $ZV_t$ device without an additional mask and/or additional processing steps. This is especially true when the form factor of the device goes below the 14 nm threshold.

Figure 3:
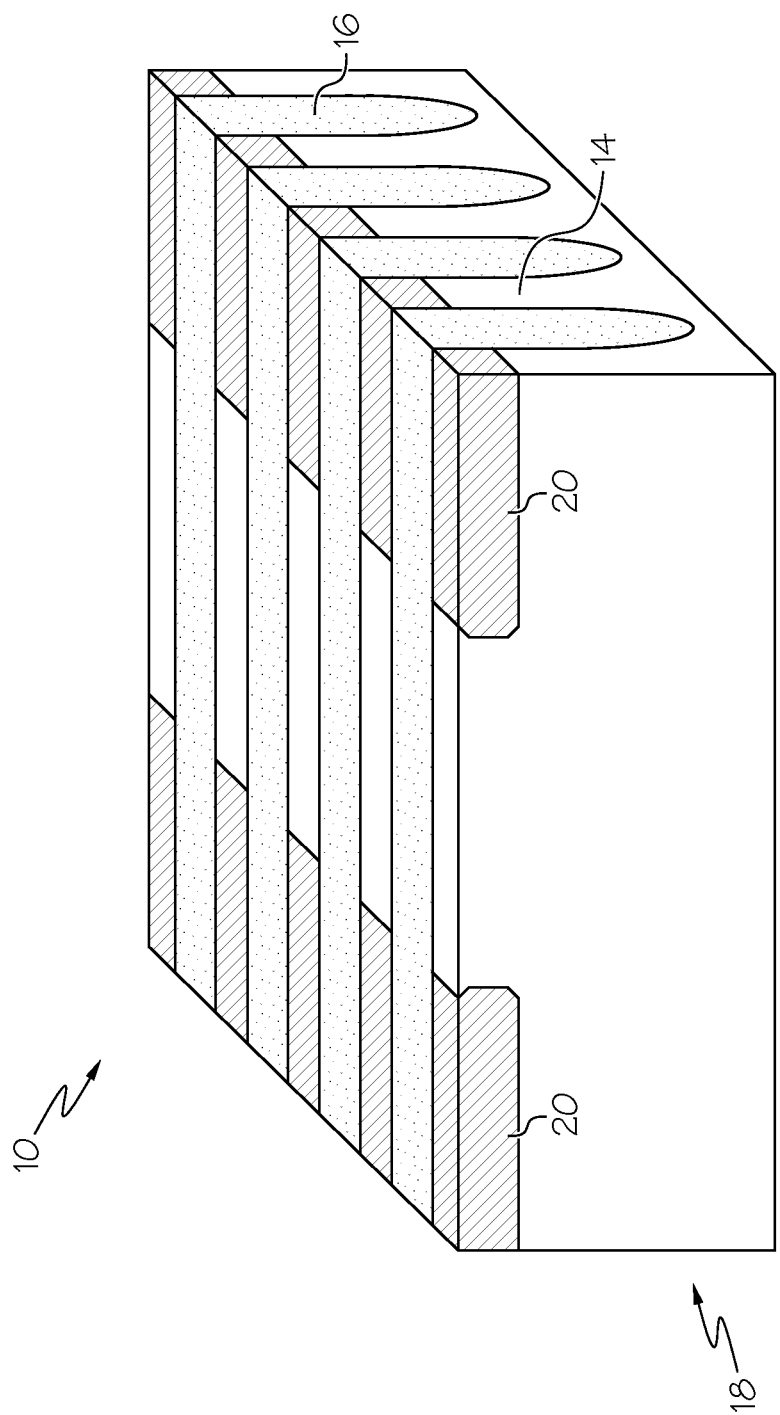
FIG. 3 shows a formation of a set of N+ regions in the FinFET semiconductor device of FIG. 2 according to an embodiment of the present invention.
Figure 4:
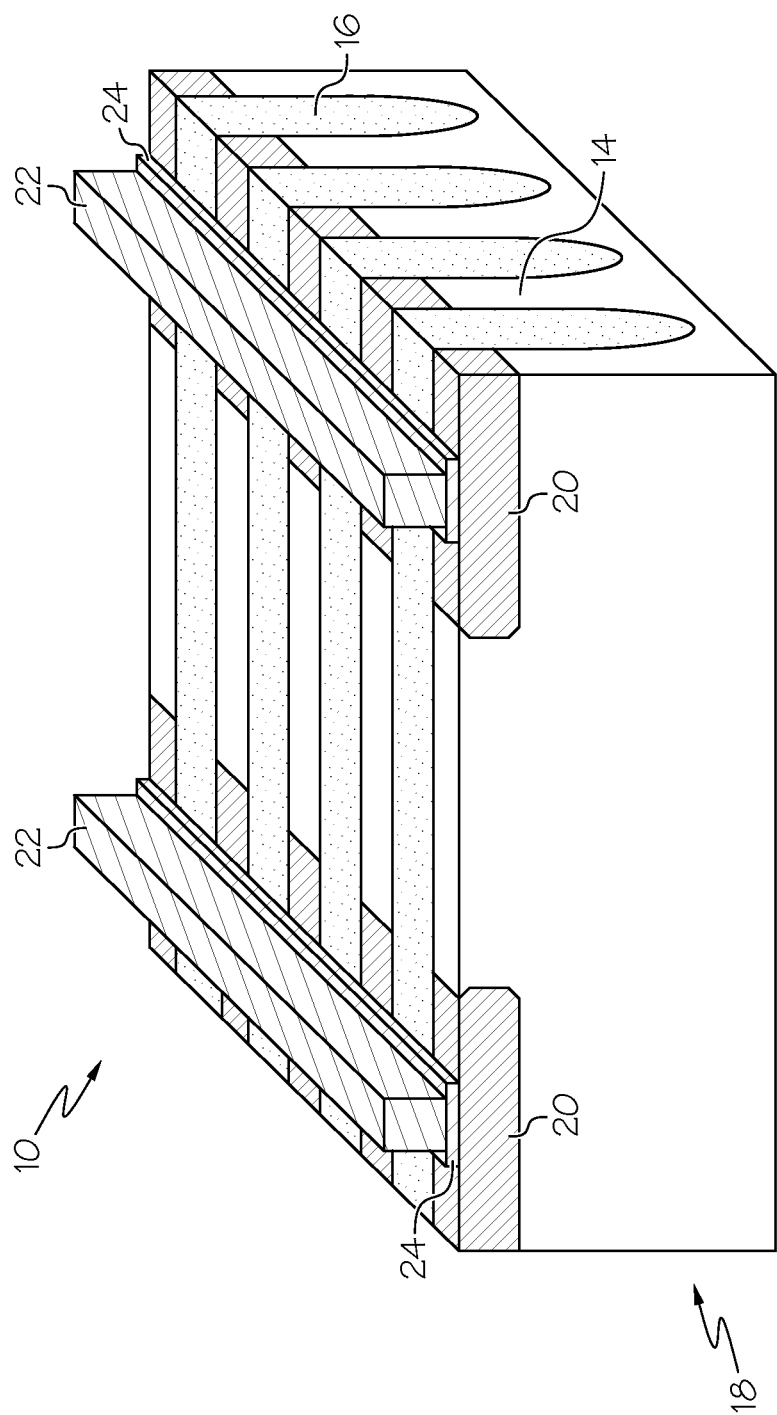
FIG. 4 shows a formation of raised source drain (RSD) structures according to an embodiment of the present invention.

Referring now to FIG. 3, a formation of a set of N+ regions in the FinFET semiconductor device of FIG. 2 according to an embodiment of the present invention is shown. For example, a portion of fins 16 of device 10 (e.g., adjacent to an outer edge of fins 16 as illustrated) can be doped with an N+ dopant to form a set (e.g., a first and second) of N+ regions 20. N+ regions 20 can be formed using any type of dopant now known or later developed and/or using any process now known or later developed. Then, in FIG. 4, a set of raised source drain (RSD) structures 22 can be formed according to an embodiment of the present invention. As illustrated, RSD structure 22 can be formed across each fin 14 of FinFET device 10. RSD structure 22 can be grown as an epitaxial structure on N+ regions 20 directly or on a previously deposited spacer 24 formed on N+ regions 20, or can be formed in any way now known or later developed. Further, RSD structure 22 can be formed using any material now known or later developed for use as a source and/or drain.

Figure 5:
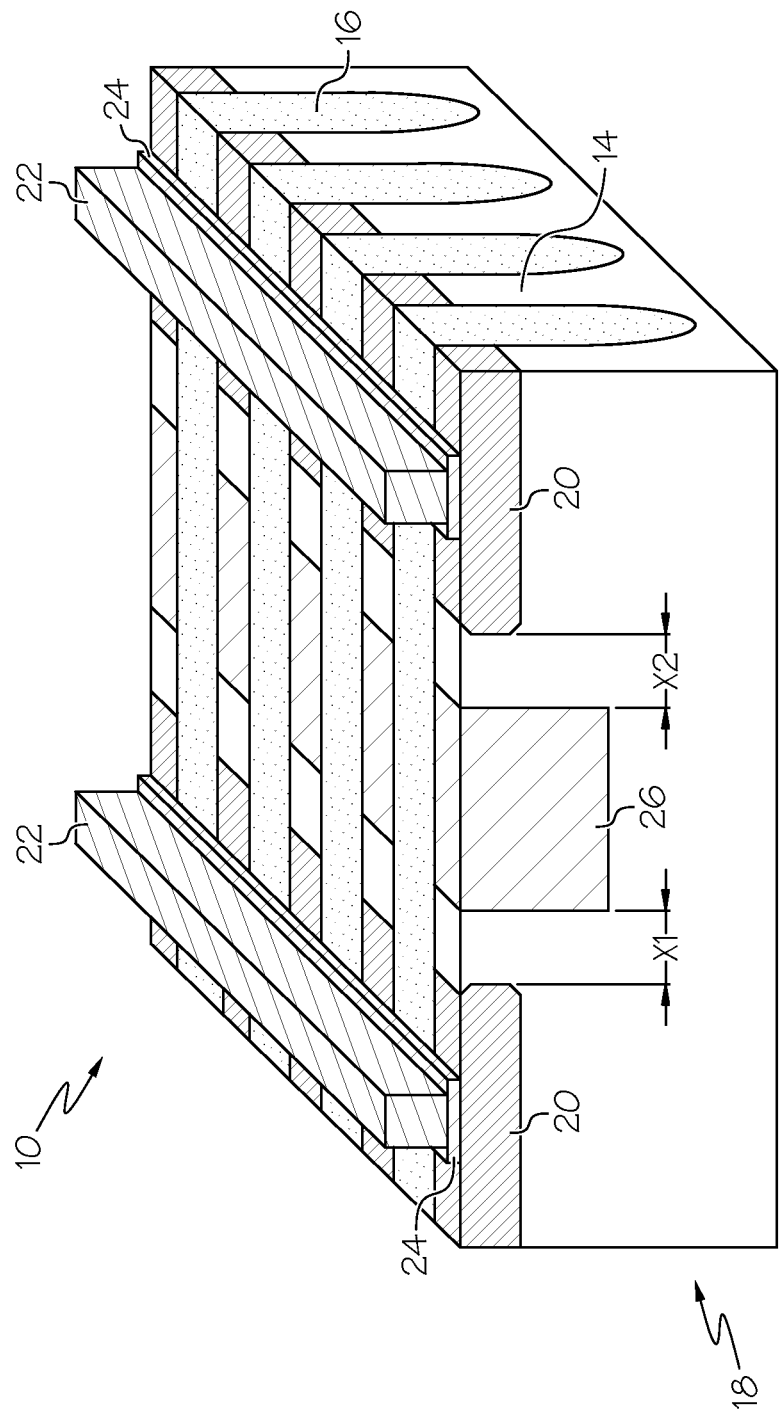
FIG. 5 shows a formation of an N-well in the fins of the FinFET semiconductor device according to an embodiment of the present invention.

Referring now to FIG. 5, a formation of an N-well region 26 in the fins of the device 10 according to an embodiment of the present invention is shown. N-well region 26 is formed between the N+ regions 20 underlying the RSD structures 22. To this extent, N+ regions can be formed either before or subsequent to formation of RSD structures 22. In any case, n-well region 26 can be implanted by opening a window by mask in p-well 18. This opening can have a distance X1, X2 from each of the N+ regions 20 respectively. This distance X1, X2 can be adjusted to control the $V_t$ of the NFets. Further, different values for X1, X2 can be used to provide a multiple $V_t$ FET. Other performance parameters of device 10 can also be optimized via the formation of n-well region 26. These properties can include, but are not limited to: CAPs, Ion, Ioff, mobility, and/or the like.

Then the surface of fins 16 between the N+ regions 20 in can be doped with a negative implant species. This negative implant species can include P, As, Sb, B, BF, Ga, In, or any other negative implant species now known or later discovered. The dopant used to create the n-well region 26 can be used to adjust the $V_t$ of device 10 to zero $V_t$. This n-well region 26 creation causes potential barriers for electron and hole carriers to form on either side of n-well region 26, causing an adjustment of $V_t$ from its original value. In an embodiment, an edge of the n-well region 26 could even abut N+ region 20. The $V_t$ and/or performance of device 10 could be further optimized by adjusting the doping gradient from source to drain or from drain to source.

Figure 6:
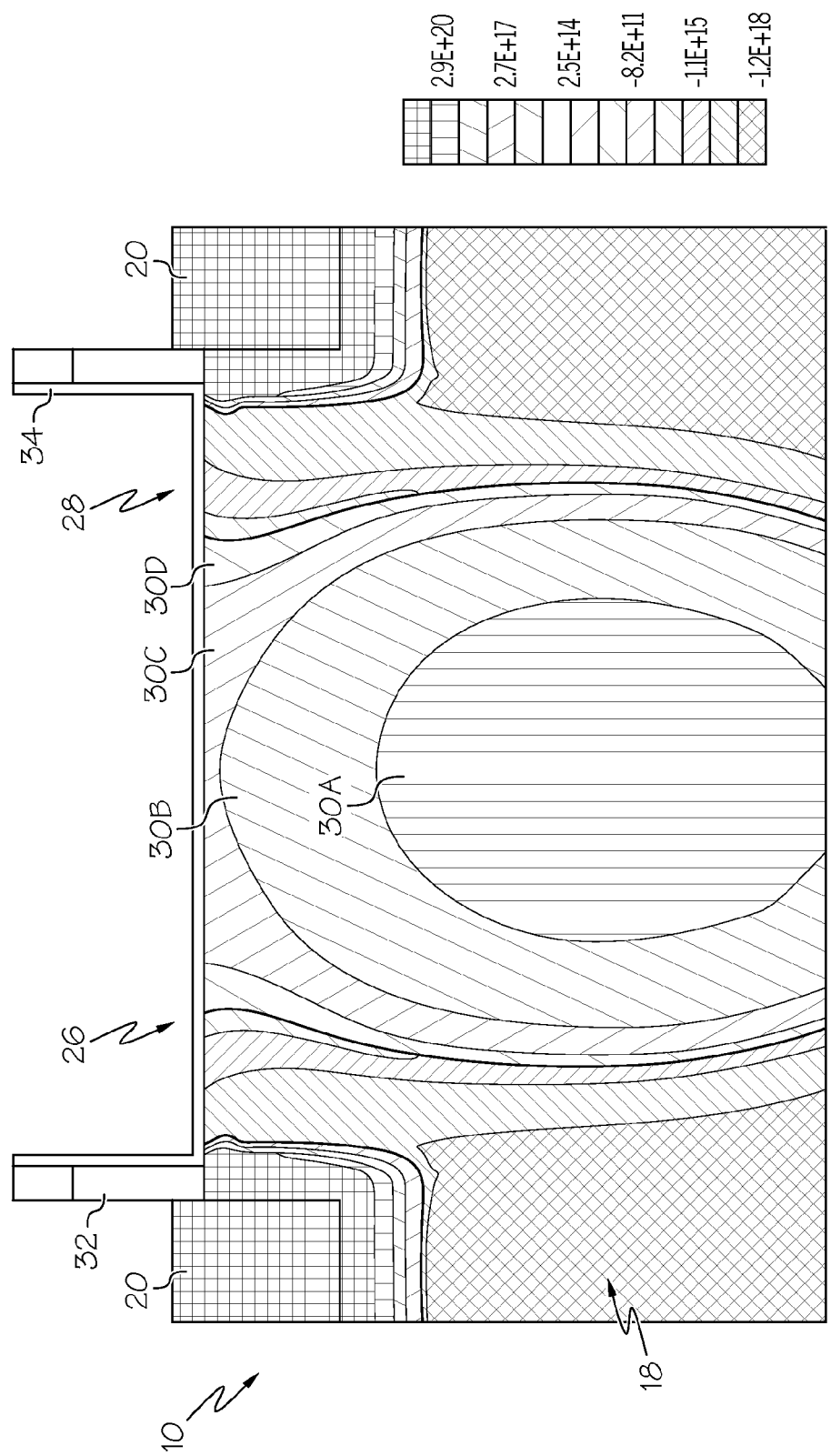
FIG. 6 shows an effect of the formation of the N-well on the FinFET semiconductor device according to an embodiment of the present invention.
Figure 7A:
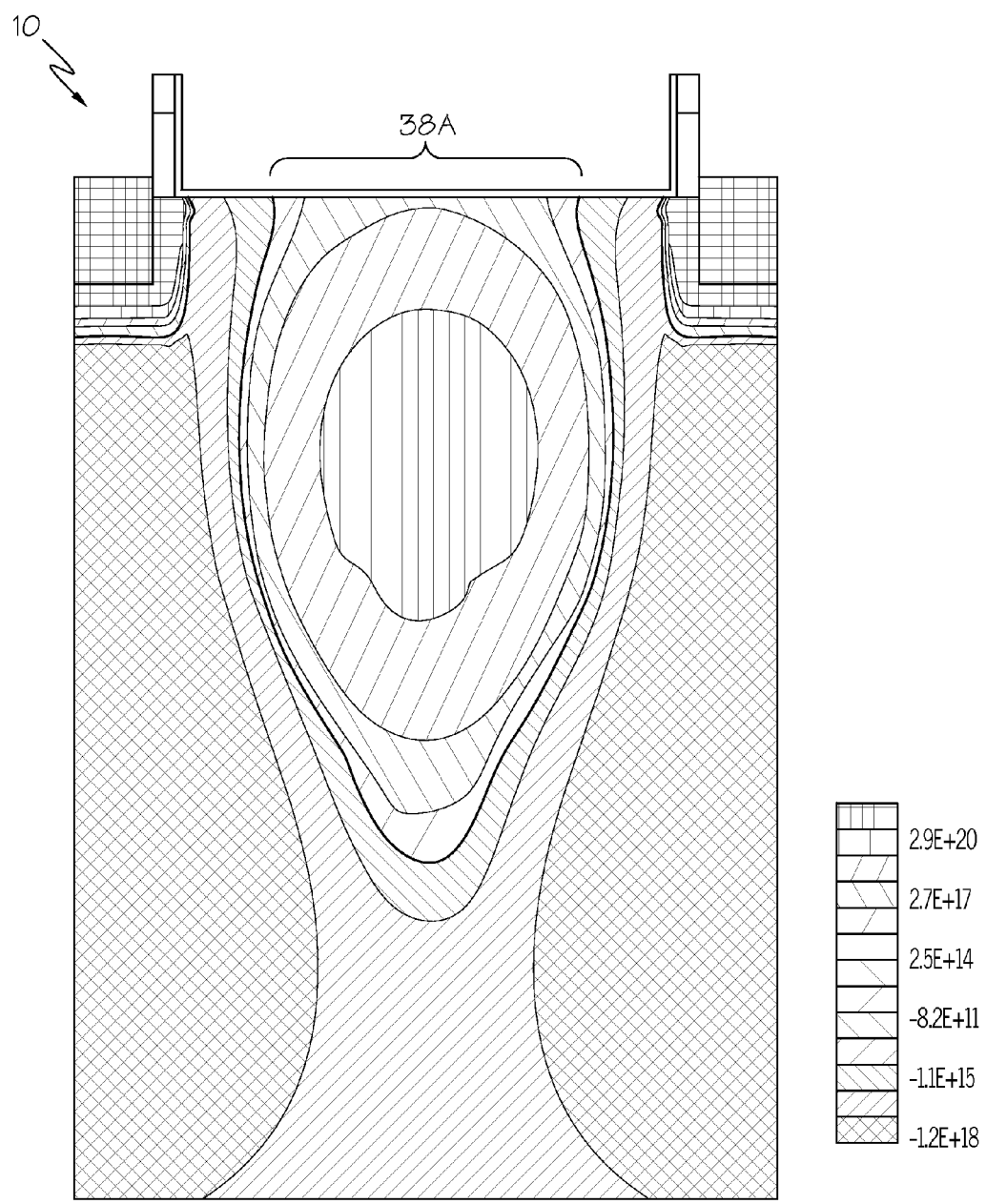
FIGS. 7A-D show alternate effects of the formation of the N-well on the FinFET semiconductor device according to embodiments of the present invention.
Figure 7B:
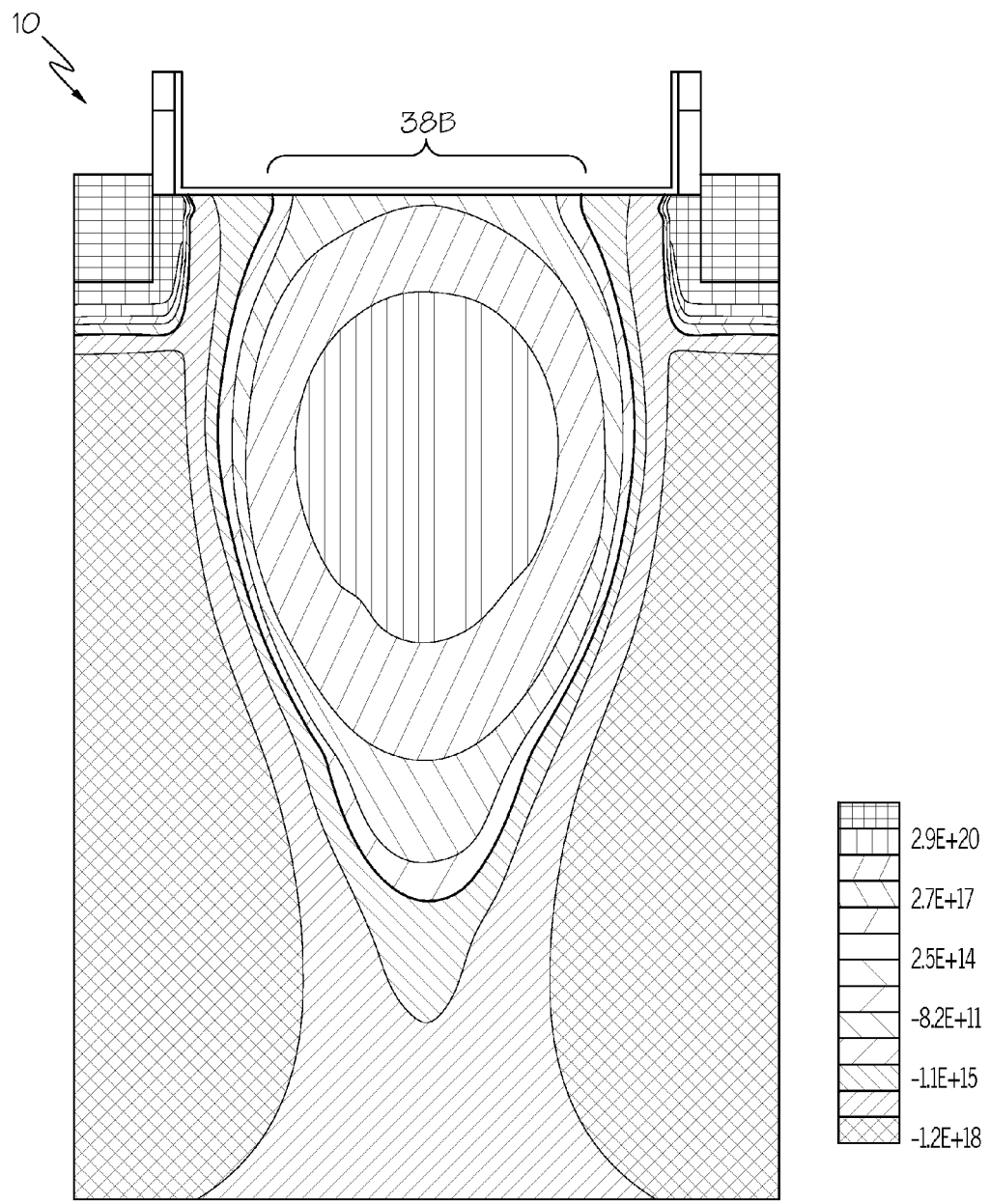
Figure 7C:
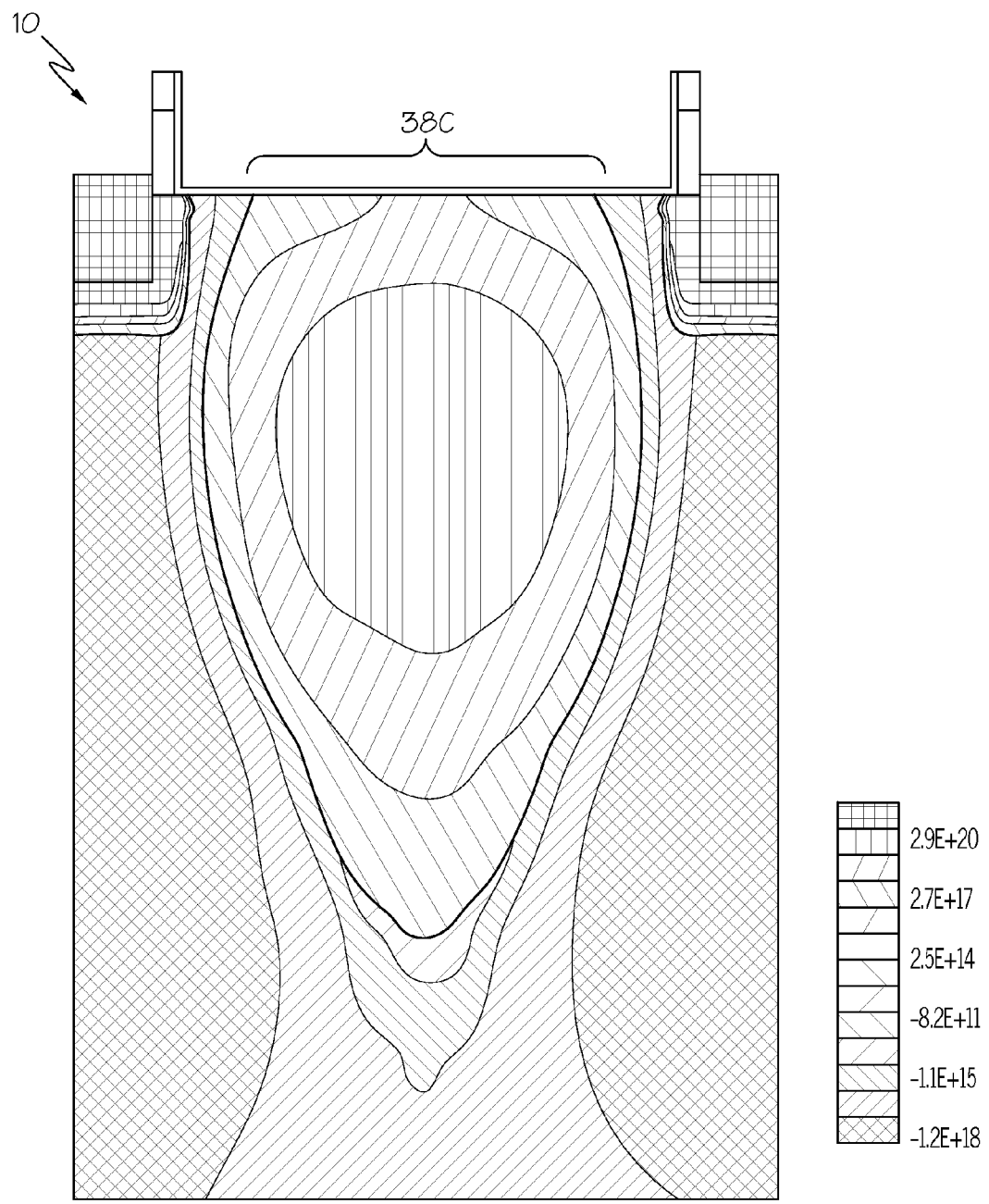
Figure 7D:
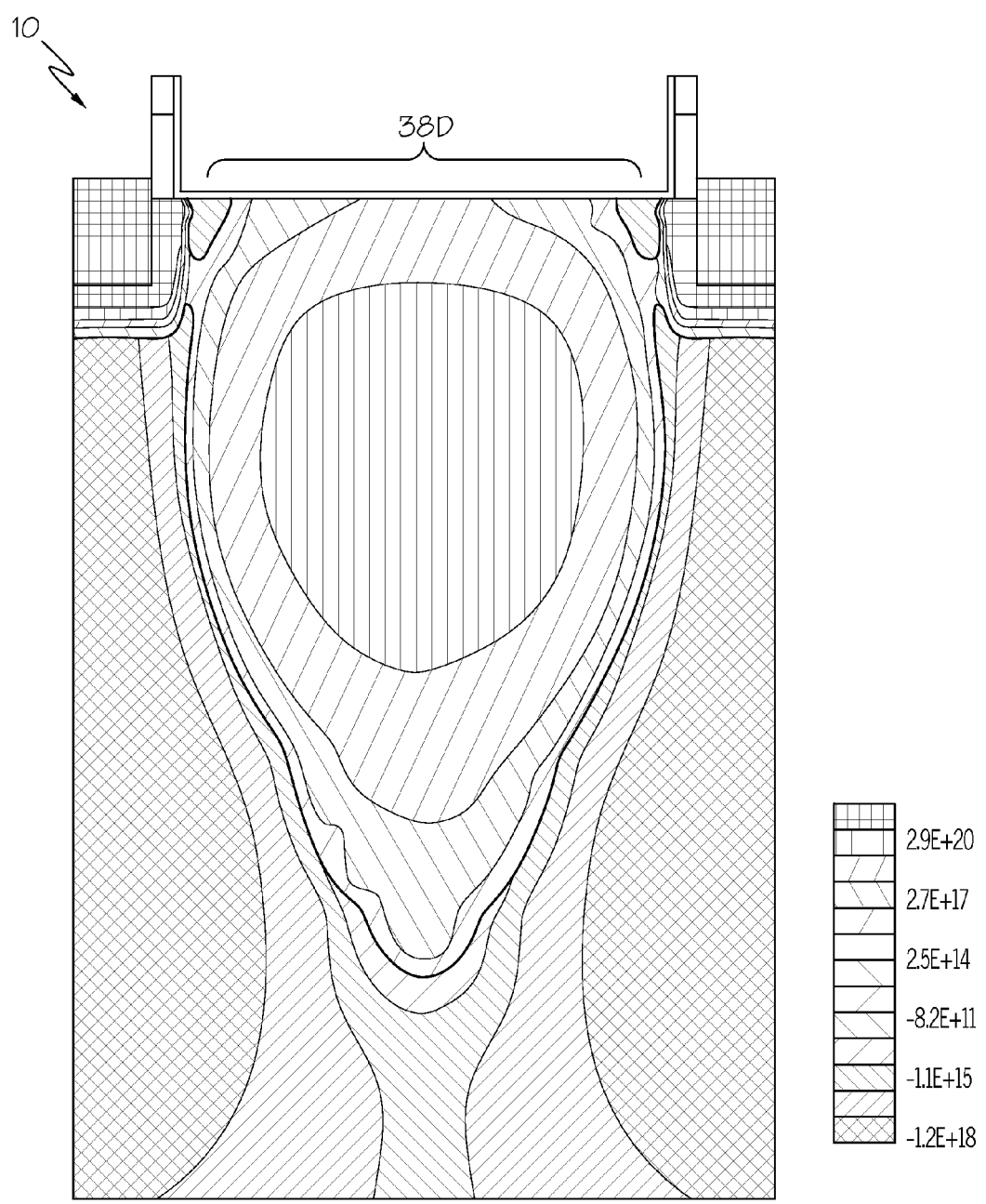

Referring now to FIG. 6, an effect of the formation of the N-well region 26 on the FinFET semiconductor device 10 according to an embodiment of the present invention is shown. As shown, n-well region 26 has been implanted in p-well region 18 of device 10. As shown, n-well region 26 has a number of different doping concentrations 30A-D with highest doping concentration 30A toward the center of n-well region 26 and successively lower doping concentrations 30B-D as distance from the center increases. Note that in the illustrated embodiment, an intermediate p-well region 28 is maintained between n-well region 26 and N+ region 20.

Referring now to FIGS. 7A-D, a number of alternate effects of the formation of the N-well region 26 on the FinFET semiconductor device 10 according to embodiments of the present invention are shown. As shown, the size 38A-D of n-well region 26 can be adjusted to meet particular performance characteristics (e.g., those discussed herein). For example, any or all of the X1, X2 (FIG. 5) values, the length of time that doping occurs, the concentration of dopant, the composition of the dopant, and/or the like, can be adjusted to adjust the size 38A-D of n-well region 26. For example, size 38A of n-well 26 is relatively small with relatively large intermediate p-well regions 28 (FIG. 6). In contrast, size 38D of n-well 26 is relatively large and has intermediate p-well regions 28 (FIG. 6) that are nonexistent or nearly so.

Figure 8:
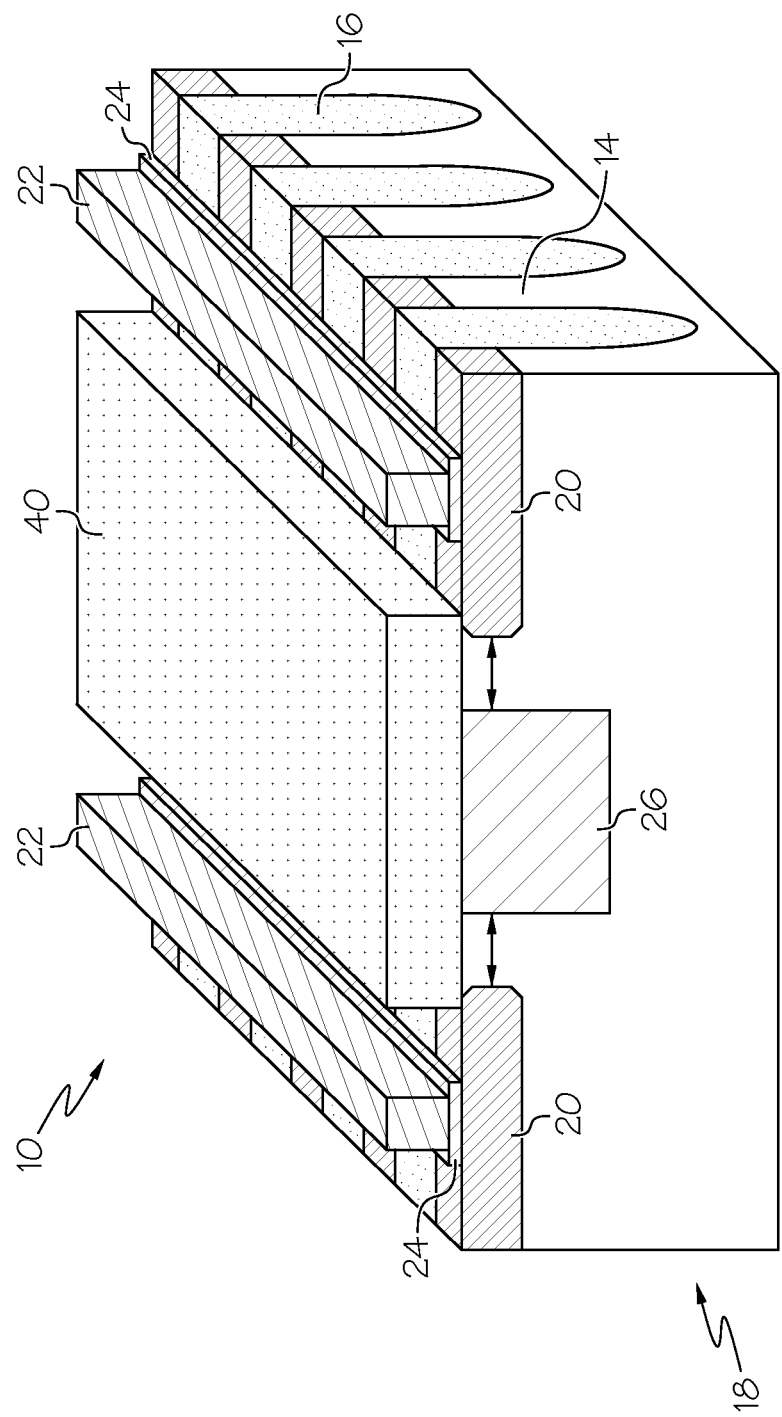
FIG. 8 shows a formation of a gate according to an embodiment of the present invention.

In any case, FIG. 8 shows a formation of a gate 40 according to embodiments of the invention. Specifically, the material forming gate 40 and, optionally, a hard mask layer (not shown) are positioned on the surface of device 10. Specifically, gate 40 is formed over n-well region 26. Gate 40 can also overlap one or more of the N+ regions 20. Further, gate 40 can be formed on a liner (not shown) and/or one or more spacers (not shown) can be formed adjacent to gate 40 (e.g., to facilitate formation of gate 40).

Gate structures 40 may be fabricated using any suitable process including one or more photolithography and etch processes. The photolithography process may include forming a photoresist layer (not shown) overlying substrate 12 (e.g., on a silicon layer), exposing the resist to a pattern, performing post-exposure bake processes, and developing the resist to form a masking element including the resist. The masking element may then be used to etch each gate 40 into the silicon layer, e.g., using reactive ion etch (RIE) and/or other suitable processes.

In one embodiment, gate structures 40 are formed by a double-patterning lithography (DPL) process. DPL is a method of constructing a pattern on a substrate by dividing the pattern into two interleaved patterns. DPL allows enhanced feature (e.g., fin) density. In this embodiment, gate structures 40 each include a gate electrode. Numerous other layers may also be present (i.e., a gate dielectric layer, interface layers, and/or other suitable features. The gate dielectric layer may include dielectric material such as silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer may be formed using processes such as photolithography patterning, oxidation, deposition, etching, and/or other suitable processes. The gate electrode may include polysilicon, silicon-germanium, a metal including metal compounds such as Mo, Cu, W, Ti, Ta, TiN, TaN, NiSi, CoSi, and/or other suitable conductive materials known in the art. The gate electrode may be formed using processes such as physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (AL- CVD), and/or other suitable processes which may be followed, for example, by photolithography and/or etching processes.

The teachings of this invention can be integrated with N+/P+ Epi, ESiGe raised source drain implant, or the like. Any gate 40 material can be used in combination with well splits parameters X1 and X2 (FIG. 5) to optimize the desired device parameters without additional cost. For example, EG/Sg gate oxide and other gate material applications are envisioned.

Other uses and/or embodiments of the invention can also be envisioned. For example, a misalignment of gate 40 can be used in conjunction with well splits parameters X1 and X2 to further optimize device performance. Further, the back body bias can be further used to improve or optimize the performance of the device 10. Additionally, or in the alternative, the implant used to form n-well region 26 can be performed at an angle to control certain parameters of device 10, such as off-state leakage or the like. Applications for a FET device 10 formed using any or a combination of the processes included herein can include various analog, mixed signal, digital circuits, etc.

It is apparent that there has been provided methods for forming an n-well region in a FinFET device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
    forming a first N+ region and a second N+ region in a fin on a finned substrate, the finned substrate having a p-well construction; and
    forming an n-well in the fin between the first N+ region and the second N+ region.

2. The method according to claim 1, further comprising forming a set of fins from the substrate to form the finned substrate, wherein each fin comprises a first N+ region, a second N+ region, and an n-well.

3. The method according to claim 1, further comprising growing a raised source-drain (RSD) structure on the first and second N+ regions.

4. The method according to claim 1, further comprising forming a gate structure over the n-well on the finned substrate.

5. The method according to claim 1, wherein the forming of the n-well further comprises doping the region of the finned substrate with a negative implant species.

6. The method according to claim 5, wherein the negative implant species is selected from a group, comprising: P, As, Sb, B, BF, Ga, or In.

7. The method according to claim 6, wherein the negative implant species includes As.

8. The method according to claim 5, further comprising adjusting the doping to adjust a threshold voltage of the device.

9. The method according to claim 8, wherein the adjusting results in a threshold voltage of zero for the device.

10. A method for forming a zero threshold voltage (ZVt) fin-shaped field effect transistor (FinFET) device, the method comprising:
    forming a first N+ region and a second N+ region on a finned substrate, the finned substrate having a p-well construction; and
    doping a region of the finned substrate located between the first N+ region and the second N+ region with a negative implant species forming a silicate over a subset of raised source-drain (RSD) structures to form an n-well,
    wherein a constitution of the n-well within the p-well construction yields the ZVt FinFET device.

11. The method according to claim 10, further comprising forming a set of fins from the substrate to form the finned substrate.

12. The method according to claim 10, further comprising growing the raised source-drain (RSD) structures on the first and second N+ regions.

13. The method according to claim 10, further comprising forming a gate structure over the n-well on the finned substrate.

14. The method according to claim 10, wherein the negative implant species is selected from a group, comprising: P, As, Sb, B, BF, Ga, or In.

15. The method according to claim 14, wherein the negative implant species includes As.

16. The method according to claim 15, further comprising adjusting the doping to adjust a threshold voltage of the device to be ZVt.

* * * * *